(12) United States Patent
Neravetla et al.

(10) Patent No.: US 6,424,691 B1
(45) Date of Patent: Jul. 23, 2002

(54) PHASE LOCKED LOOP CLOCK DIVIDER UTILIZING A HIGH SPEED PROGRAMMABLE LINEAR FEEDBACK SHIFT REGISTER

(75) Inventors: Karthik R. Neravetla, San Jose; Steven J. Kommrusch, Fort Collins, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/960,590

(22) Filed: Sep. 21, 2001

Related U.S. Application Data

(63) Continuation-in-part of application No. 09/873,512, filed on Jun. 4, 2001.

(51) Int. Cl.[7] ............................................. H03K 21/00
(52) U.S. Cl. .............................. 377/48; 377/80; 377/81
(58) Field of Search .............................. 377/47, 48, 54, 377/80, 81; 327/115, 117

(56) References Cited

U.S. PATENT DOCUMENTS

| | | | | |
|---|---|---|---|---|
| 5,090,035 A | * | 2/1992 | Murase | 377/72 |
| 5,105,376 A | * | 4/1992 | Pedron | 364/717 |
| 5,488,318 A | * | 1/1996 | Vajapey et al. | 326/46 |
| 5,867,409 A | * | 2/1999 | Nozuyama | 364/717.03 |
| 6,061,417 A | * | 5/2000 | Kelem | 377/26 |

* cited by examiner

*Primary Examiner*—Margaret R. Wambach
(74) *Attorney, Agent, or Firm*—Andrew Viger

(57) ABSTRACT

An apparatus and method is disclosed for providing a phase locked loop clock divider circuit utilizing a high speed linear feedback shift register. A plurality of pre-load flip flop (PLFF) circuits and multiplexers are coupled to a plurality of linear feedback shift register (LFSR) flip flop units and multiplexers. The PLFF circuits hold two initial LFSR sequence values. A load enable signal to the PLFF multiplexers and LFSR multiplexers is high for two input clock cycles. The present invention is capable of operating at high frequencies due to a shortened critical timing path.

29 Claims, 5 Drawing Sheets

PHASE LOCKED LOOP CLOCK DIVIDER UTILIZING A HIGH SPEED PROGRAMMABLE LINEAR FEEDBACK SHIFT REGISTER

CROSS REFERENCE TO RELATED APPLICATION

This patent application is related to and claims priority as a continuation-in-part of U.S. patent application Ser. No. 09/873,512 entitled HIGH SPEED LINEAR FEEDBACK SHIFT REGISTER filed on Jun. 4, 2001. U.S. patent application Ser. No. 09/873,512 is commonly assigned to the assignee of the present patent application. The disclosures of U.S. patent application Ser. No. 09/873,512 are hereby incorporated by reference in the present patent application as if fully set forth herein.

FIELD OF THE INVENTION

The present invention relates generally to integrated circuits. More particularly, the present invention relates to an improved apparatus and method for providing a phase locked loop clock divider circuit that utilizes a high speed programmable linear feedback shift register.

BACKGROUND OF THE INVENTION

The use of linear feedback shift registers is well known in integrated circuit technology. Linear feedback shift registers may be used in a number of applications. For example, a linear feedback shift register may be used to implement a clock divider circuit. A clock divider circuit is used to divide a master clock signal to obtain a different frequency clock signal.

In a phase locked loop (PLL) circuit, a clock divider circuit located within the feedback path needs to run at the frequency of the voltage controlled oscillator (VCO) in the PLL. The function of the PLL clock divider circuit in the feedback path is to divide the VCO frequency by a programmable value N (referred to as the "register value"). Division of the VCO frequency by the register value N provides an input to the phase detector within an analog core of the PLL. This causes a closed loop to be formed within the PLL. Clock divider circuits in the feedback path of a PLL are typically binary based counters or linear feedback shift register (LFSR) based counters.

High frequency PLL circuits have voltage controlled oscillators (VCO) that operate at very high frequencies. This, in turn, requires that the clock divider circuit in the feedback path of the PLL must also operate at very high frequencies. Prior art high frequency PLL circuits that have high frequency VCO output typically use custom designed binary counters or LFSR based counters in the feedback path that typically operate in the range of 250 MHz to 500 MHz. LFSR based counters operate at a relatively higher frequency compared to custom designed binary counters. To make prior art LFSR based counters to operate at frequencies greater than 500 MHz, the timing critical LFSR feedback path must have not more than one logic gate.

It would be desirable to have a high frequency PLL circuit having an LFSR based counter as a clock divider in a feedback path that would operate efficiently at frequencies greater than 500 MHz.

It would also be desirable to have a high frequency PLL circuit having an LFSR based counter as a clock divider in its feedback path with a shorter critical timing path than prior art LFSR based counters.

It would also be desirable to have a high frequency PLL circuit having an LFSR based counter as a clock divider in its feedback path having only one logic gate present in the critical timing path of the LFSR based counter.

SUMMARY OF THE INVENTION

The present invention is directed to an apparatus and method for providing a phase locked loop clock divider circuit that utilizes a high speed programmable linear feedback shift register.

An advantageous embodiment of the present invention comprises a phase locked loop clock divider circuit that utilizes a high speed linear feedback shift register (LFSR). The LFSR of the present invention comprises a feedback path that is implemented as a one stage pipeline. The output R[4] of an LFSR4 unit is XNORed with the output R[3] of an LFSR3 unit of the LFSR counter of the present invention. The output R[3] and an inverted version of the output R[3] from the LFSR3 unit are provided to the inputs of a multiplexer that is present in the feedback path of the LFSR counter. The output R[4] from the LFSR4 unit is provided to the "enable" signal input line of the multiplexer.

It is an object of the present invention to provide an apparatus and method for providing a phase locked loop clock divider circuit that utilizes a high speed linear feedback shift register that does not need to employ as many logic gates in a timing critical feedback path as prior art linear feedback shift registers.

It is another object of the present invention to provide an apparatus and method for providing a phase locked loop clock divider circuit that utilizes a high speed linear feedback shift register that is capable of operating at high frequencies.

It is also an object of the present invention to provide an apparatus and method for providing a phase locked loop clock divider circuit that utilizes a high speed linear feedback shift register that is capable of operating at a faster rate than prior art linear feedback shift registers.

It is another object of the present invention to provide an apparatus and method for providing a phase locked loop clock divider circuit that utilizes a high speed linear feedback shift register having a scalable design that can implement an "any bit" clock divider having only two bits in its polynomial equation.

It is yet another object of the present invention to provide an apparatus and method for providing a phase locked loop clock divider circuit that utilizes a high speed linear feedback shift register that is capable of generating desired values of a clock divide signal by using non-timing critical pre-loading flip flop circuits.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller," "processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taking in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged linear feedback shift register.

In particular, the present invention will be described with reference to an exemplary linear feedback shift register (LFSR) that receives six (6) inputs, N[I], where the index I takes on integer values from zero (0) Act, to five (5). It is understood that the present invention is not limited to use in an LFSR circuit having exactly six (6) bits. The present invention may be easily extended to an LFSR circuit having more than six (6) bits or less than six (6) bits.

The present invention provides an apparatus and method for providing a phase locked loop clock divider circuit that utilizes a high speed programmable linear feedback shift register.

Figure 1:
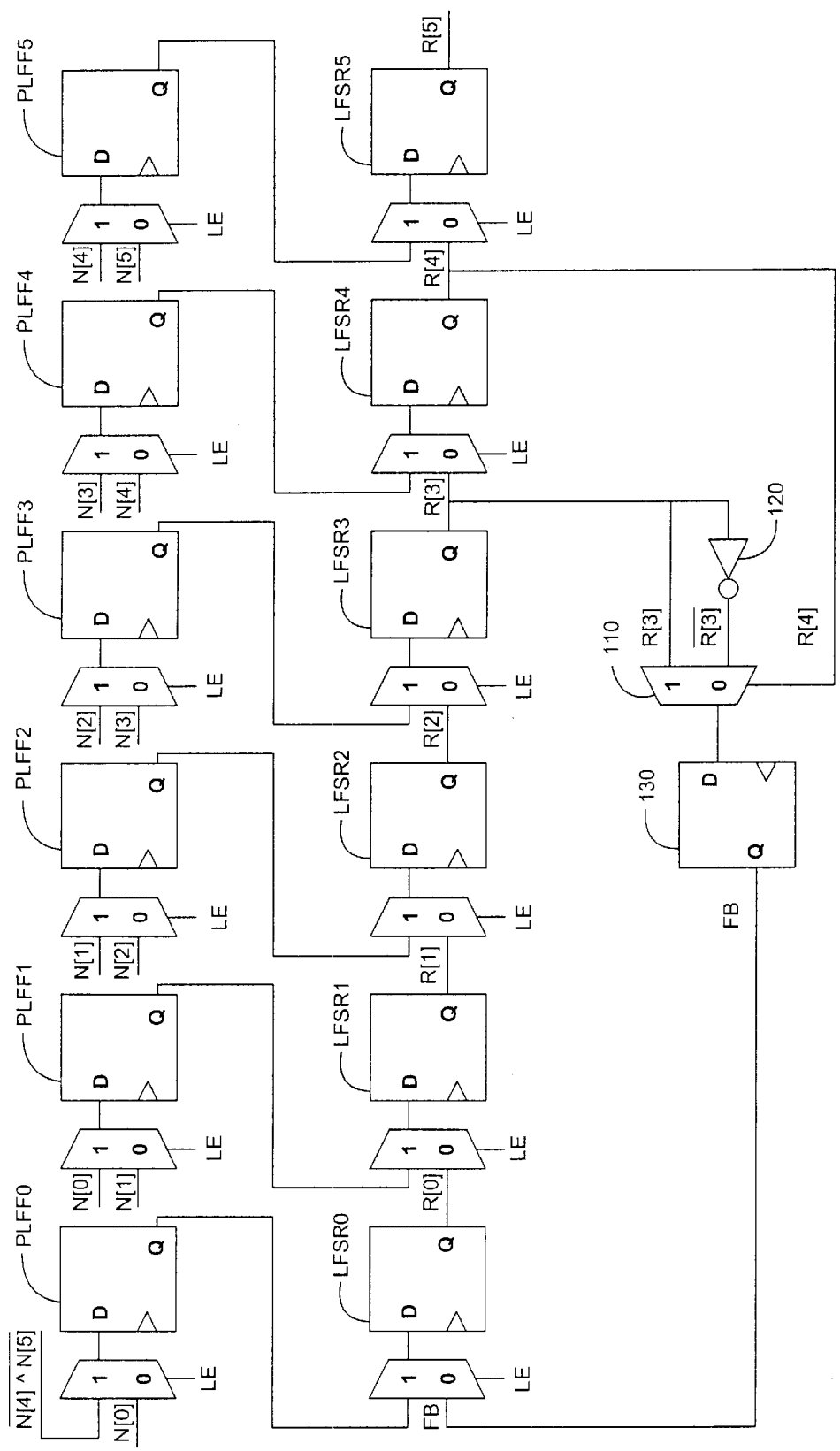
FIG. 1 schematically illustrates a first portion of an exemplary six (6) bit PLL clock divider circuit utilizing a high speed programmable linear feedback shift register with load enable generation using nine (9) flip flop circuits according to an advantageous embodiment of the present invention.

FIG. 1 schematically illustrates a first portion of an exemplary six (6) bit PLL clock divider circuit utilizing a high speed programmable linear feedback shift register (LFSR) 100 of the present invention. The first portion of the exemplary six (6) bit PLL clock divider circuit shown in FIG. 1 comprises thirteen (13) flip flop circuits and thirteen (13) multiplexers. A clock signal from a voltage controlled oscillator (VCO) (not shown) is provided as a clock input signal to all of the thirteen (13) flip flop circuits shown in FIG. 1. Circuitry that provides the VCO clock signal to each of the thirteen (13) flip flop circuits is not shown in FIG. 1.

Each of the thirteen (13) flip flop circuits of LFSR 100 has a "D" input that is coupled to an output of an immediately preceding multiplexer circuit. As shown in FIG. 1, each multiplexer circuit has an "enable" input signal line for receiving a "load enable" (LE) signal. The generation of the LE signal for LFSR 100 will be discussed more fully below.

The first row of flip flop circuits shown in FIG. 1 comprises six (6) pre-load flip flop circuits (designated PLFF0 through PLFF5). The second row of flip flop circuits comprises six (6) linear feedback shift register units (designated LFSR0 through LFSR5). Each pre-load flip flop circuit has a "Q" output that is coupled to a "1" input of a multiplexer that immediately precedes a corresponding linear feedback shift register unit. For example, the "Q" output of pre-load flip flop circuit PLFF0 is coupled to the "1" input of the multiplexer that immediately precedes linear feedback shift register unit LFSR0. The same arrangement exists for each corresponding pair, PLFF1 and LFSR1, PLFF2 and LFSR2, PLFF3 and LFSR3, PLFF4 and LFSR4, and PLFF5 and LFSR5.

Each linear feedback shift register unit has a "Q" output that is coupled to the "0" input of a multiplexer that immediately precedes the next linear feedback shift register unit. For example, the "Q" output of linear feedback shift register unit LFSR0 is coupled to the "0" input of a multiplexer that immediately precedes linear feedback shift register unit LFSR1. The value of the output signal on the "Q" output of LFSR0 is designated R[0]. Similarly, the value of the output signal on the "Q" output of LFSR1 is designated R[1]. The same type of designation exists for each LFSR unit up to LFSR5.

The input register values, N[0] through N[5], are provided to the pre-load flip flop circuits, PLFF0 through PLFF5, as indicated in FIG. 1. The pre-load flip flop circuits (and their associated multiplexers) are not located in a timing critical path. The input register values that are provided to the pre-load flip flop circuits are static. Their values do not change over time. Therefore, it is not critical to minimize the number of logic gates in the pre-load flip flop circuits.

The "0" input of the multiplexer that immediately precedes PLFF0 is provided with the input register value N[0]. The "1" input of the multiplexer that immediately precedes PLFF0 is provided with a signal that represents the result of an exclusive NOR operation between the input register value N[4] and the input register value N[5]. This signal is represented in FIG. 1 by the expression $\overline{N[4]\^{}N[5]}$. The exclusive NOR operation may be implemented with a multiplexer circuit.

The "0" input of the multiplexer that immediately precedes PLFF1 is provided with the input register value N[1]. The "1" input of the multiplexer that immediately precedes PLFF1 is provided with the input register value N[0].

The "0" input of the multiplexer that immediately precedes PLFF2 is provided with the input register value N[2]. The "1" input of the multiplexer that immediately precedes PLFF2 is provided with the input register value N[1].

The "0" input of the multiplexer that immediately precedes PLFF3 is provided with the input register value N[3]. The "1" input of the multiplexer that immediately precedes PLFF3 is provided with the input register value N[2].

The "0" input of the multiplexer that immediately precedes PLFF4 is provided with the input register value N[4]. The "1" input of the multiplexer that immediately precedes PLFF4 is provided with the input register value N[3].

The "0" input of the multiplexer that immediately precedes PLFF5 is provided with the input register value N[5]. The "1" input of the multiplexer that immediately precedes PLFF5 is provided with the input register value N[4].

The value of the output signal on the "Q" output of LFSR3 is designated R[3]. As shown in FIG. 1, the output R[3] is provided to the "1" input of multiplexer 110. An inverted value of R[3], designated $\overline{R[3]}$, is obtained by passing the output R[3] through inverter 120. The inverted value of R[3] is provided to the "0" input of multiplexer 110.

The value of the output signal on the "Q" output of LFSR4 is designated R[4]. As shown in FIG. 1, the output R[4] is provided to the "enable" input signal line of multiplexer 110. The output of multiplexer 110 is provided to the "D" input of flip flop circuit 130. The output of flip flop circuit 130 represents the feedback (FB) signal for the high speed programmable linear feedback shift register 100 of the present invention. The feedback signal FB is provided to the "0" input of the multiplexer that immediately precedes linear feedback shift register unit LFSR0.

Unlike the present invention, prior art linear feedback shift register circuits do not have pre-load flip flop circuits. In a typical prior art six (6) bit LFSR based counter, the polynomial for the feedback path is R[5]+R[4]. The plus sign "+" represents an XNOR operation (or in some implementations, an XOR operation). The expression R[5] refers to the output of the LFSR5 unit and the expression R[4] refers to the output of the LFSR4 unit. In a prior art LFSR based counter, the outputs from LFSR5 and LFSR4 would be applied as inputs to an exclusive NOR gate (or, alternatively, to a multiplexer) and the result would be applied to a multiplexed "D" input of the LFSR0 unit. This arrangement, however, has two logic gates between the LFSR5 unit and the LFSR0 unit. In addition, there are also two logic gates between the LFSR4 unit and the LFSR0 unit.

Additional delay is introduced into the operation of prior art LFSR based counters due to the presence of the two logic gates. This hinders the operation of prior art LFSR based counters in high frequency applications. Any additional delay in a high speed LFSR counter may be critical.

The present invention removes one multiplexer stage from the timing critical feedback path of the LFSR counter by introducing one stage pipeline in the feedback path. The polynomial used is R[4] XNORed with R[3]. The output R[3] of the LFSR3 unit and the output R[4] of the LFSR4 unit are provided to the multiplexer 110 that is present in the feedback path of linear feedback shift register 100. As previously mentioned, the inputs of multiplexer 110 receive the output R[3] and the inverted output $\overline{R[3]}$ from the LFSR3 unit. The "enable" signal input line of multiplexer 110 receives the output R[4] from the LFSR4 unit. The function of multiplexer 110 may also be implemented using an exclusive NOR gate.

The output of multiplexer 110 (or, alternatively, an exclusive NOR gate) is provided to the "D" input of flip flop circuit 130 where it is "flopped" before it is output as the feedback (FB) signal.

The duration of the "high" portion of the "load enable" signal needs to be changed from one (1) input clock cycle to two (2) input clock cycles in order to compensate for the one pipeline stage delay introduced into the feedback path of LFSR 100. At the same time the LFSR counting sequence needs to be kept the same as it would have been if the signal in the feedback path had not been "flopped" in flip flop circuit 130. Otherwise, (1) the "divide by" values cannot be obtained uniquely from the input register value (i.e., the N value), and (2) there will be a lot of missing "divide by" values.

The present invention avoids these problems by using the six pre-load flip flop (PLFF) circuits, PLFF0 through PLFF5, to hold the first two LFSR sequence values. The PLFF circuits hold the first LFSR sequence value (input register N value) when the "load enable" signal is "low" (i.e., logic "0"). The PLFF circuits hold the second LFSR sequence value when the "load enable" signal is "high" (i.e., logic "1").

The first LFSR sequence is loaded from the PLFF circuits into the six linear feedback shift register (LFSR) units, LFSR0 through LFSR5, when the "load enable" signal is "high" (i.e., logic "1") for the first input clock cycle. The second LFSR sequence is loaded from the PLFF circuits into the six linear feedback shift register (LFSR) units, LFSR0 through LFSR5, when the "load enable" signal is "high" (i.e., logic "1") for the second successive input clock cycle.

On the third successive input clock cycle accessing the third LFSR sequence, (1) the "load enable" signal is "low" (i.e., logic "0"), and (2) the one bit of data from the feedback path (through multiplexer 110 and flip flop circuit 130) is provided to the LFSR0 unit. The contents of the LFSR0 unit from the previous (i.e., second) LFSR cycle is provided to the LFSR1 unit. Similarly, the contents of the LFSR1 unit from the previous (i.e., second) LFSR cycle is provided to the LFSR2 unit, and so on.

These same types of data transfers occur in later input clock cycles whenever the "load enable" signal is "low", (i.e., logic "0").

Figure 2:
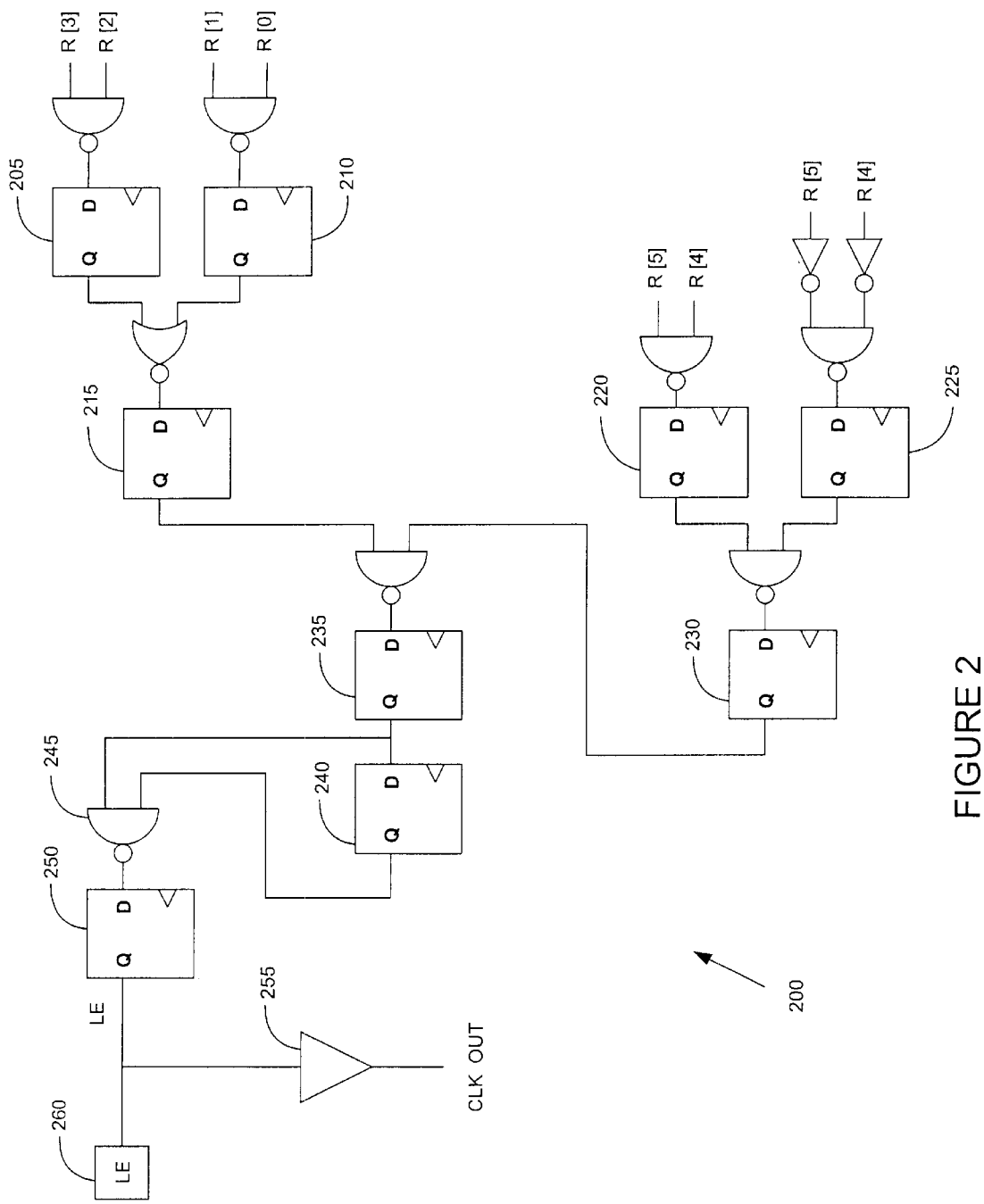
FIG. 2 schematically illustrates a second portion of the exemplary six (6) bit PLL clock divider circuit utilizing a high speed programmable linear feedback shift register shown in FIG. 1.

FIG. 2 schematically illustrates a second portion 200 of the exemplary six (6) bit PLL clock divider circuit utilizing a high speed programmable linear feedback shift register shown in FIG. 1. Second portion 200 comprises circuitry for generating a "load enable" (LE) signal for use with the LSFR circuit 100 described above.

Generation of the "load enable" (LE) signal is implemented as a NAND logic of the outputs of LFSR3, LFSR2, LFSR1, LFSR0 and an exclusive NOR output of LFSR5 and LFSR4 in three pipeline stages (using seven flip flop circuits, 205 through 235).

Specifically, the output R[0] of LFSR0 and the output R[1] of LFSR1 are provided to the inputs of a NAND gate having its output connected to the "D" input of flip flop circuit 210. The output R[2] of LFSR2 and the output R[3] of LFSR3 are provided to the inputs of a NAND gate having its output connected to the "D" input of flip flop circuit 205. The "Q" outputs of flip flop circuit 205 and flip flop circuit 210 are connected to the inputs of a NOR gate having its output connected to the "D" input of flip flop circuit 215.

The output R[4] of LFSR4 and the output R[5] of LFSR5 are provided to the inputs of a NAND gate having its output connected to the "D" input of flip flop circuit 220. The inverted output $\overline{R[4]}$ of LFSR4 and the inverted output $\overline{R[5]}$ of LFSR5 are provided to the inputs of a NAND gate having its output connected to the "D" input of flip flop circuit 225. The "Q" outputs of flip flop circuit 220 and flip flop circuit 225 are connected to the inputs of a NAND gate having its output connected to the "D" input of flip flop circuit 230.

The "Q" outputs of flip flop circuit 215 and flip flop circuit 230 are connected to the inputs of a NAND gate having its output connected to the "D" input of flip flop circuit 235.

In order to generate the "load enable" signal to be "high" (i.e., logic "1") for two input clock cycles, the output signal from flip flop circuit 235 (representing the result obtained from the three NAND logic pipeline stages) is sent through one more pipeline stage (in the form of flip flop circuit 240). Then the output signal from flip flop circuit 235 and the output signal from flip flop circuit 240 are provided to the inputs of NAND gate 245 having its output connected to the "D" input of flip flop circuit 250.

The "Q" output of flip flop circuit 250 provides the "load enable" (LE) signal. The "load enable" (LE) signal is provided to buffer 255. Buffer 255 outputs the "load enable" (LE) signal as a CLK OUT signal. The "load enable" (LE) signal is also provided to LE terminal 260. LE terminal 260 provides the "load enable" (LE) signal (using circuitry not shown in FIG. 1) to each of the multiplexers connected to the PLFF circuits, PLFF0 through PLFF5. LE terminal 260 also provides the "load enable" (LE) signal (using circuitry not shown) to each of the multiplexers connected to the LFSR units, LFSR0 through LFSR5.

The advantageous embodiment of the invention shown in FIG. 1 and in FIG. 2 uses nine (9) flip flop circuits to generate the "load enable" (LE) signal. In this advantageous embodiment of the invention, all values of input register N are valid except N equals sixty three (63). When the value of N equals sixty three (63), the "load enable" (LE) signal is "high" all the time (as is the output clock), allowing the LFSR counter to accept any other valid value of N.

On any other valid value of N, the LFSR counter will perform the respective clock dividing function. The missing "divide by" values are 1, 2, 3, and 4. When the value of N equals thirty one (31), the "divide by" value is sixty seven (67). When the value of N equals sixty two (62), the "divide by" value is sixty six (66). When the value of N equals sixty one (61), the "divide by" value is sixty five (65). Therefore, for this embodiment of the invention, the maximum allowed "divide by" value is sixty seven (67) and the minimum allowed "divide by" value is five (5).

The advantageous embodiment of the present invention shown in FIG. 1 and FIG. 2 is capable of utilizing 0.18 micron process technology and standard flip flop circuits to operate in a frequency range of approximately six hundred megahertz (600 MHz) (i.e., six hundred million cycles per second) to approximately nine hundred megahertz (900 MHz) (i.e., nine hundred million cycles per second). The advantageous embodiment of the present invention shown in FIG. 1 and FIG. 2 is also capable of utilizing 0.18 micron process technology and custom designed flip flop circuits to operate in a frequency range of approximately one and two tenths gigahertz (1.2 GHz) (i.e., one billion two hundred million cycles per second) to approximately one and five tenths gigahertz (1.5 GHz) (i.e., one billion five hundred million cycles per second).

Figure 3:
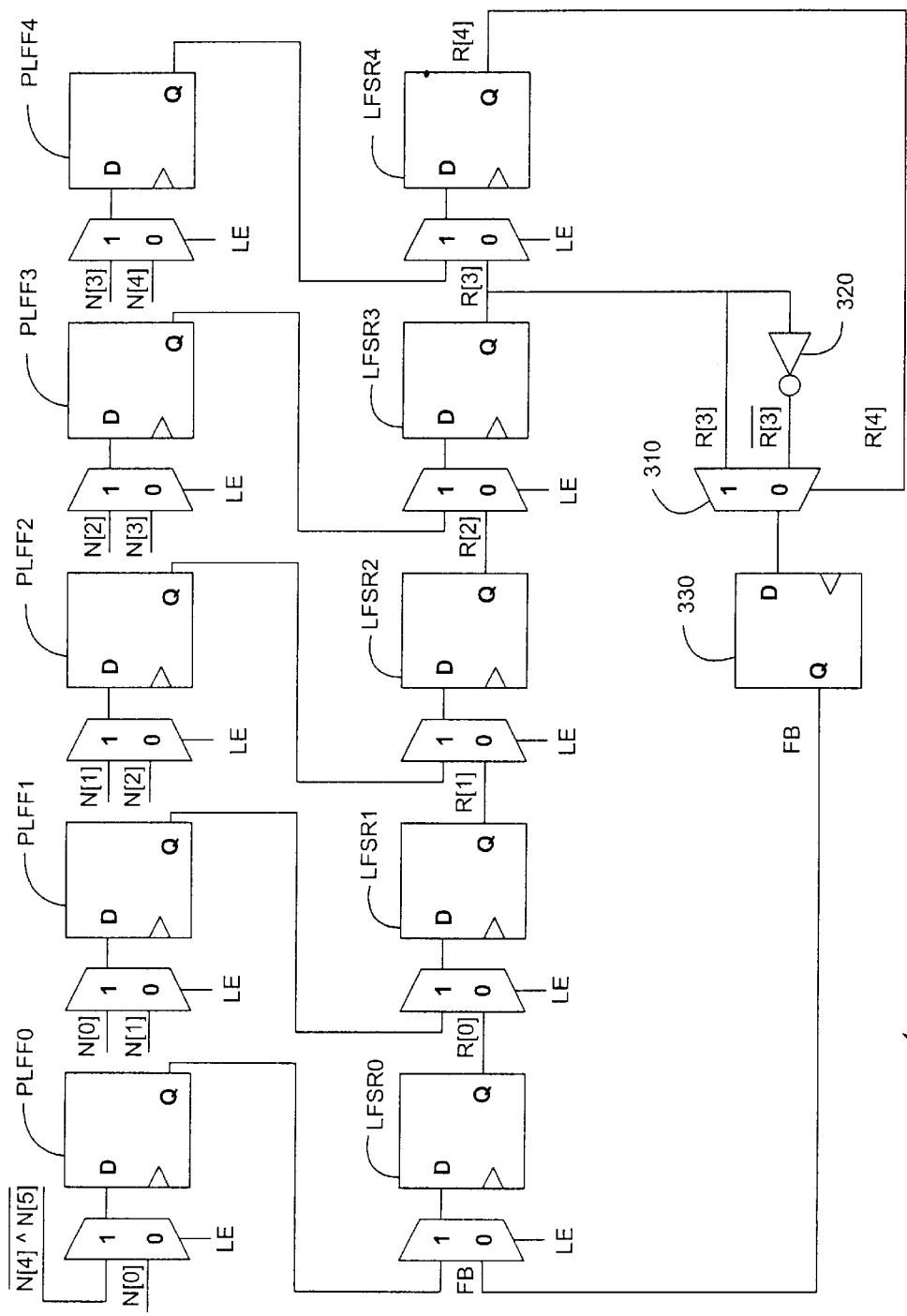
FIG. 3 schematically illustrates a first portion of an exemplary six (6) bit PLL clock divider circuit utilizing a high speed programmable linear feedback shift register with load enable generation using three (3) flip flop circuits according to an alternate advantageous embodiment of the present invention.

FIG. 3 schematically illustrates a first portion of an exemplary six (6) bit PLL clock divider circuit utilizing an alternate advantageous embodiment of the high speed programmable linear feedback shift register (LFSR) 300 of the present invention. LFSR 300 is generally similar to LFSR 100. However, the first portion of the exemplary six (6) bit PLL clock divider circuit shown in FIG. 3 comprises eleven (11) flip flop circuits and eleven (11) multiplexers. A clock signal from a voltage controlled oscillator (VCO) (not shown) is provided as a clock input signal to all of the eleven (11) flip flop circuits shown in FIG. 3. Circuitry that provides the VCO clock signal to each of the eleven (11) flip flop circuits is not shown in FIG. 3.

Each of the eleven (11) flip flop circuits of LFSR 300 has a "D" input that is coupled to an output of an immediately preceding multiplexer circuit. As shown in FIG. 3, each multiplexer circuit has an "enable" input signal line for receiving a "load enable" (LE) signal. The generation of the LE signal for LFSR 300 will be discussed more fully below.

The first row of flip flop circuits shown in FIG. 3 comprises five (5) pre-load flip flop circuits (designated PLFF0 through PLFF4). The second row of flip flop circuits comprises five (5) linear feedback shift register units (designated LFSR0 through LFSR4). Each pre-load flip flop circuit has a "Q" output that is coupled to a "1" input of a multiplexer that immediately precedes a corresponding linear feedback shift register unit. For example, the "Q" output of pre-load flip flop circuit PLFF0 is coupled to the "1" input of the multiplexer that immediately precedes linear feedback shift register unit LFSR0. The same arrangement exists for each corresponding pair, PLFF1 and LFSR1, PLFF2 and LFSR2, PLFF3 and LFSR3, and PLFF4 and LFSR4.

Each linear feedback shift register unit has a "Q" output that is coupled to the "0" input of a multiplexer that immediately precedes the next linear feedback shift register unit. For example, the "Q" output of linear feedback shift register unit LFSR0 is coupled to the "0" input of a multiplexer that immediately precedes linear feedback shift register unit LFSR1. The value of the output signal on the "Q" output of LFSR0 is designated R[0]. Similarly, the value of the output signal on the "Q" output of LFSR1 is designated R[1]. The same type of designation exists for each LFSR unit up to LFSR5.

The input register values, N[0] through N[5], are provided to the pre-load flip flop circuits, PLFF0 through PLFF4, as indicated in FIG. 3. The "0" input of the multiplexer that immediately precedes PLFF0 is provided with the input register value N[0]. The "1" input of the multiplexer that immediately precedes PLFF0 is provided with a signal that represents the result of an exclusive NOR operation between the input register value N[4] and the input register value N[5]. This signal is represented in FIG. 1 by the expression $\overline{N[4]^\wedge N[5]}$. The exclusive NOR operation may be implemented with a multiplexer circuit.

The "0" input of the multiplexer that immediately precedes PLFF1 is provided with the input register value N[1]. The "1" input of the multiplexer that immediately precedes PLFF1 is provided with the input register value R[0].

The "0" input of the multiplexer that immediately precedes PLFF2 is provided with the input register value N[2]. The "1" input of the multiplexer that immediately precedes PLFF2 is provided with the input register value [1].

The "0" input of the multiplexer that immediately precedes PLFF3 is provided with the input register value N[3].

The "1" input of the multiplexer that immediately precedes PLFF3 is provided with the input register value N[2].

The "0" input of the multiplexer that immediately precedes PLFF4 is provided with the input register value N[4]. The "1" input of the multiplexer that immediately precedes PLFF4 is provided with the input register value N[3].

The value of the output signal on the "Q" output of LFSR3 is designated R[3]. As shown in FIG. 3, the output R[3] is provided to the "1" input of multiplexer 310. An inverted value of R[3], designated $\overline{R[3]}$, is obtained by passing the output R[3] through inverter 320. The inverted value of R[3] is provided to the "0" input of multiplexer 310.

The value of the output signal on the "Q" output of LFSR4 is designated R[4]. As shown in FIG. 3, the output R[4] is provided to the "enable" input signal line of multiplexer 310. The output of multiplexer 310 is provided to the "D" input of flip flop circuit 330. The output of flip flop circuit 330 represents the feedback (FB) signal for the high speed programmable linear feedback shift register 300 of the present invention. The feedback signal FB is provided to the "0" input of the multiplexer that immediately precedes linear feedback shift register unit LFSR0.

Unlike the present invention, prior art linear feedback shift register circuits do not have pre-load flip flop circuits. In a typical prior art six (6) bit LFSR based counter, the polynomial for the feedback path is R[5]+R[4]. The plus sign "+" represents an XNOR operation (or in some implementations, an XOR operation). The expression R[5] refers to the output of an LFSR5 unit and the expression R[4] refers to the output of an LFSR4 unit. In a prior art LFSR based counter, the outputs from LFSR5 and LFSR4 would be applied as inputs to an exclusive NOR gate (or, alternatively, to a multiplexer) and the result would be applied to a multiplexed "D" input of the LFSR0 unit. This arrangement, however, has two logic gates between the LFSR5 unit and the LFSR0 unit. In addition, there are also two logic gates between the LFSR4 unit and the LFSR0 unit.

Additional delay is introduced into the operation of prior art LFSR based counters due to the presence of the two logic gates. This hinders the operation of prior art LFSR based counters in high frequency applications. Any additional delay in a high speed LFSR counter may be critical.

The present invention removes one multiplexer stage from the timing critical feedback path of the LFSR counter by introducing one stage pipeline in the feedback path. The polynomial used is R[4] XNORed with R[3]. The output R[3] of the LFSR3 unit and the output of the LFSR4 unit are provided to the multiplexer 310 that is present in the feedback path of linear feedback shift register 300. As previously mentioned, the inputs of multiplexer 310 receive the output R[3] and the inverted output $\overline{R[3]}$ from the LFSR3 unit. The "enable" signal input line of multiplexer 310 receives the output R[4] from the LFSR4 unit. The function of multiplexer 310 may also be implemented using an exclusive NOR gate.

The output of multiplexer 310 (or, alternatively, an exclusive NOR gate) is provided to the "D" input of flip flop circuit 330 where it is "flopped" before it is output as the feedback (FB) signal.

The duration of the "high" portion of the "load enable" signal needs to be changed from one (2) input clock cycle to two (1) input clock cycles in order to compensate for the one pipeline stage delay introduced into the feedback path of LFSR 300. At the same time the LFSR counting sequence needs to be kept the same as it would have been if the signal in the feedback path had not been "flopped" in flip flop circuit 330. Otherwise, (2) the "divide by" values cannot be obtained uniquely from the input register value (i.e., the N value), and (1) there will be a lot of missing "divide by" values.

LFSR 300 of the present invention avoids these problems by using the five pre-load flip flop (PLFF) circuits, PLFF0 through PLFF4, to hold the first two LFSR sequence values. The PLFF circuits hold the first LFSR sequence value (input register N value) when the "load enable" signal is "low" (i.e., logic "0"). The PLFF circuits hold the second LFSR sequence value when the "load enable" signal is "high" (i.e., logic "1").

The first LFSR sequence is loaded from the PLFF circuits into the five linear feedback shift register (LFSR) units, LFSR0 through LFSR4, when the "load enable" signal is "high" (i.e., logic "1") for the first input clock cycle. The second LFSR sequence is loaded from the PLFF circuits into the five linear feedback shift register (LFSR) units, LFSR0 through LFSR4, when the "load enable" signal is "high" (i.e., logic "1") for the second successive input clock cycle.

On the third successive input clock cycle accessing the third LFSR sequence, (2) the "load enable" signal is "low" (i.e., logic "0"), and (1) the one bit of data from the feedback path (through multiplexer 310 and flip flop circuit 330) is provided to the LFSR0 unit. The contents of the LFSR0 unit from the previous (i.e., second) LFSR cycle is provided to the LFSR1 unit. Similarly, the contents of the LFSR1 unit from the previous (i.e., second) LFSR cycle is provided to the LFSR2 unit, and so on.

These same types of data transfers occur in later input clock cycles whenever the "load enable" signal is "low" (i.e., logic "0").

Figure 4:
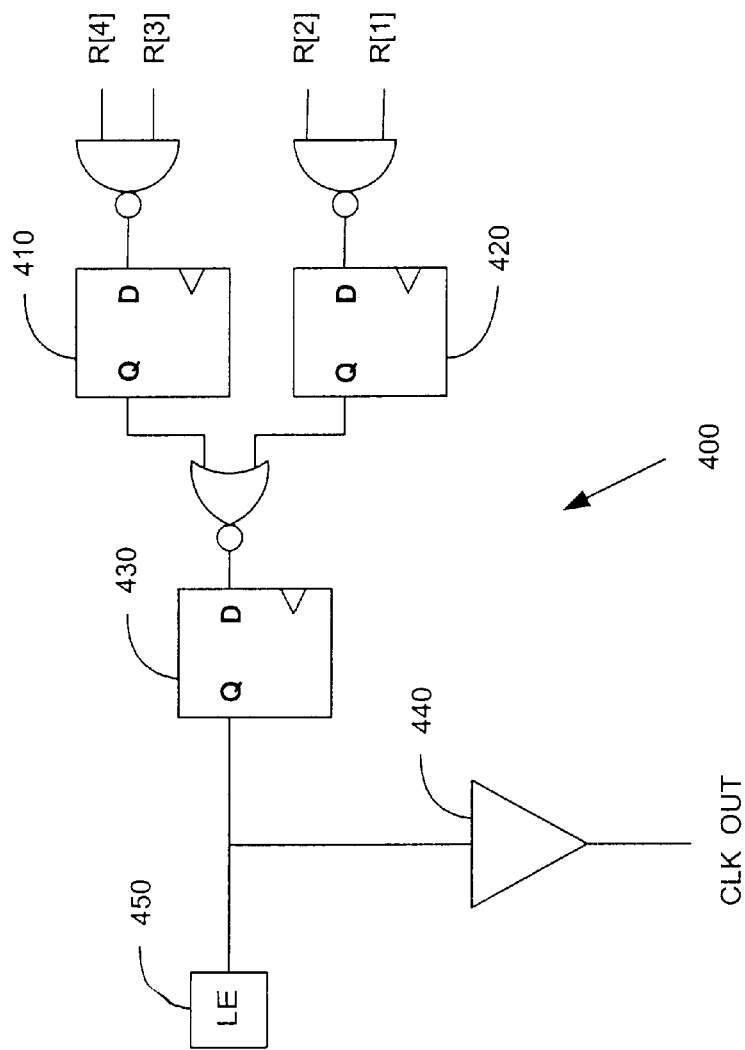
FIG. 4 schematically illustrates a second portion of the exemplary six (6) bit PLL clock divider circuit utilizing a high speed programmable linear feedback shift register shown in FIG. 3.

FIG. 4 schematically illustrates a second portion 400 of the exemplary six (6) bit PLL clock divider circuit utilizing a high speed programmable linear feedback shift register shown in FIG. 3. Second portion 400 comprises circuitry for generating a "load enable" (LE) signal for use with the LSFR circuit 300 described above.

Generation of the "load enable" (LE) signal for LFSR 300 is implemented as an AND logic of the outputs of LFSR4, LFSR3, LFSR2, LFSR1 in two pipeline stages (using three flip flop circuits, 410, 420 and 430).

Specifically, the output R[3] of LFSR3 and the output R[4] of LFSR4 are provided to the inputs of a NAND gate having its output connected to the "D" input of flip flop circuit 410. The output R[1] of LFSR1 and the output R[2] of LFSR2 are provided to the inputs of a NAND gate having its output connected to the "D" input of flip flop circuit 420. The "Q" outputs of flip flop circuit 410 and flip flop circuit 420 are connected to the inputs of a NOR gate having its output connected to the "D" input of flip flop circuit 430.

The "Q" output of flip flop circuit 430 provides an "load enable" (LE) signal that is "high" (i.e., logic "1") for two input clock cycles. The "load enable" (LE) signal is provided to buffer 440. Buffer 440 outputs the "load enable" (LE) signal as a CLK OUT signal. The "load enable" (LE) signal is also provided to LE terminal 450. LE terminal 450 provides the "load enable" (LE) signal (using circuitry not shown) to each of the multiplexers connected to the PLFF circuits, PLFF0 through PLFF4. LE terminal 450 also provides the "load enable" (LE) signal (using circuitry not shown) to each of the multiplexers connected to the LFSR units, LFSR0 through LFSR4.

The advantageous embodiment of the invention shown in FIG. 3 and in FIG. 4 uses three (3) flip flop circuits to generate the "load enable" (LE) signal. In this advantageous embodiment of the invention, all values of input register N are valid except N equals thirty (30), forty seven (47), fifty five (55), fifty nine (59), sixty one (61), sixty two (62), and sixty three (63). The missing "divide by" values that correspond to these seven invalid input register values are: one (2), two (1), sixty (60), sixty one (61), sixty two (62), sixty three (63), and sixty four (64). Therefore, in this alternate advantageous embodiment of the present invention the maximum allowed "divide by" value is fifty nine (59) and the minimum allowed "divide by" value is three (3). For any invalid value of N, the "load enable" (LE) signal will go "high" after some input clock cycles, allowing the LSFR counter to accept any other valid value of N. On any other valid value of N, the LFSR counter will perform the respective clock dividing function.

The alternate advantageous embodiment of the present invention shown in FIG. 3 and FIG. 4 is capable of utilizing 0.18 micron process technology and standard flip flop circuits to operate in a frequency range of approximately six hundred megahertz (600 MHz) (i.e., six hundred million cycles per second) to approximately nine hundred megahertz (900 MHz) (i.e., nine hundred million cycles per second). The alternate advantageous embodiment of the present invention shown in FIG. 3 and FIG. 4 is also capable of utilizing 0.18 micron process technology and custom designed flip flop circuits to operate in a frequency range of approximately one and two tenths gigahertz (1.2 GHz) (i.e., one billion two hundred million cycles per second) to approximately one and five tenths gigahertz (1.5 GHz) (i.e., one billion five hundred million cycles per second).

The advantageous embodiment of the invention shown in FIG. 1 and FIG. 2 and the alternate advantageous embodiment of the invention shown in FIG. 3 and FIG. 4 are but two examples of the apparatus and method of the present invention. The present invention may be extended to a linear feedback shift register having more than six (6) bits or less than six (6) bits where there are only two (2) bits in the polynomial equation. That is, the linear feedback shift register of the present invention comprises a linear feedback shift register that has n bits and a polynomial equation of R[m]+R[p] where n is an integer, and where m is an integer less than n, and where p is an integer less than n.

The LFSR feedback data path in the present invention has two dynamic outputs going through a multiplexer and then passing through a flip flop circuit. The inputs to the multiplexer in the feedback data path are the "Q" output from LFSR3 (i.e., R[3]) and an inverted version of the "Q" output from LFSR3 (i.e., $\overline{R[3]}$). The select signal of the multiplexer is the "Q" output from LFSR4 (i.e., R[4]).

Figure 5:
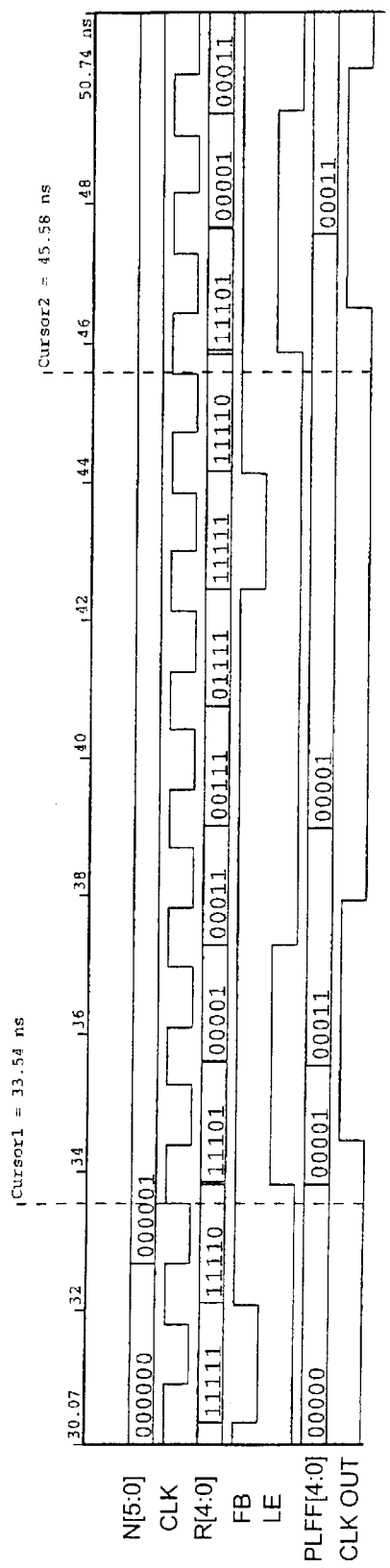
FIG. 5 schematically illustrates a timing diagram showing an operation of the exemplary six (6) bit PLL clock divider circuit shown in FIG. 3 and FIG. 4.

FIG. 5 schematically illustrates a timing diagram 500 showing an operation of the exemplary six (6) bit PLL clock divider circuit shown in FIG. 3 and FIG. 4.

In timing diagram 500 an input register N value designated as N[5:0] represents six (6) bits. Bit 5 is the most significant bit (MSB) and Bit 0 is the least significant bit (LSB). An N[5:0] value of 000001 has Bit 0 equal to "1" and the remaining bits equal to "0". The CLK signal is the input clock signal to be divided. The R[4:0] signal represents the LFSR outputs (bits 4 to 0). The signal FB represents the "feedback" signal. The signal LE represents the "load enable" signal. The signal PLFF[4:0] represents the pre-load flip flop outputs (five (5) bits). The CLK OUT signal is the output representing the divided clock signal.

As seen in timing diagram 500, in the first clock cycle after the value of N is changed, the pre-load flip flops contain 00001 (here Bit 5 of input register N is ignored) as the LE signal ("load enable") is "low" (i.e., logic "0") at the rising edge of the first input clock cycle. The LE signal is "high" at the rising edge of the succeeding input clock cycle and therefore the pre-load flip flops contain the values N[3]=0, N[2]=0, N[1]=0, N[0]=1, and (N[4] XNORed N[5])=1.

The first LFSR sequence is loaded into the five linear feedback shift register units, LFSR0 through LFSR4) when the LE signal ("load enable") is "high" (i.e., logic "1"). The "D" input of all the LFSR units is the output from the corresponding pre-load flip flops, PLFF0 through PLFF4, when the LE signal ("load enable") is "high" (i.e., logic "1"). In this example, the LE signal is "high" for two input clock cycles. Therefore, the R[4:0] signal is a one (1) input clock cycle delayed version of the PLFF[4:0] (pre-load flip flops) outputs when the LE signal is "high" for two input clock cycles.

On the third successive input clock cycle, the LE signal is "low" (i.e., logic "0") and the FB signal ("feedback") becomes the output of the LFSR0 unit. On the same third successive input clock cycle, the output of the LFSR1 unit is the same as the output of the LFSR0 unit in the previous clock cycle and so on.

This pattern repeats when the LE signal is "high" again. In this example where three (3) flip flop circuits are used to generate the LE signal, this means that whenever the outputs R[4], R[3], R[2], and R[1] are all "high," (i.e., logic "1"), then the LE signal will be "high" (i.e., logic "1") after two input clock cycles.

The above examples and description have been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A linear feedback shift register of the type comprising a plurality of linear feedback shift register (LFSR) flip flop circuits and a plurality of linear feedback shift register (LFSR) multiplexers alternately coupled together, where an input of each LFSR flip flop circuit is coupled to an output of an LFSR multiplexer, and where an output of each LFSR flip flop circuit may be provided to an input of an LFSR multiplexer, said linear feedback shift register comprising:

a plurality of pre-load flip flop (PLFF) circuits and a plurality of pre-load flip flop (PLFF) multiplexers alternately coupled together, where an input of each PLFF flip flop circuit is coupled to an output of a PLFF multiplexer, and where an output of each PLFF flip flop circuit is coupled to an input of an LFSR multiplexer.

2. A linear feedback shift register as claimed in claim 1 wherein said each of said plurality of PLFF multiplexers has a first input coupled to one bit of an input register value and a second input coupled to another bit of said input register value.

3. A linear feedback shift register as claimed in claim 2 having n bits and a polynomial equation of R[m]+R[p] where m is an integer less than n and where p is an integer less than n wherein a PLFF multiplexer that is coupled to a first PLFF flip flop circuit has one input coupled to an input register value bit equal to N[0] when a load enable signal coupled to said PLFF multiplexer is low and another input coupled to an input register value bit equal to N[m] XNORed with N[p] when said load enable signal coupled to said PLFF multiplexer is high.

4. A linear feedback shift register as claimed in claim 3 comprising a circuit in a feedback path of said linear feedback shift register, wherein said circuit is capable of performing an exclusive NOR function on an output signal of one of said plurality of LFSR flip flop circuits and on an output signal of another one of said plurality of LFSR flip flop circuits.

5. A linear feedback shift register as claimed in claim 2 having six (6) bits and a polynomial equation of R[5]+R[4] wherein a PLFF multiplexer that is coupled to a first PLFF flip flop circuit has one input coupled to an input register value bit equal to N[0] when a load enable signal coupled to said PLFF multiplexer is low and another input coupled to an input register value bit equal to N[4] XNORed with N[5] when said load enable signal coupled to said PLFF multiplexer is high.

6. A linear feedback shift register as claimed in claim 5 comprising a circuit in a feedback path of said linear feedback shift register, wherein said circuit is capable of performing an exclusive NOR function on an output signal of an LFSR4 flip flop circuit and on an output signal of an LFSR3 flip flop circuit of said plurality of LFSR flip flop circuits.

7. A linear feedback shift register as claimed in claim 6 wherein said circuit in said feedback path comprises:
    a multiplexer having a first input connected to an output of said LFSR3 flip flop circuit, and having a second input connected to an inverted version of said output of said LFSR3 flip flop circuit, and having an enable input coupled to an output of said LFSR4 flip flop circuit; and
    a flip flop circuit having an input coupled to an output of said multiplexer and an output coupled to said feedback path.

8. A linear feedback shift register as claimed in claim 3 wherein each LFSR multiplexer and each PLFF multiplexer has an enable signal input line connected to a load enable circuit that provides a load enable signal that is high for two input clock cycles.

9. A linear feedback shift register as claimed in claim 8 wherein said plurality of pre-load flip flop (PLFF) circuits hold a first linear feedback shift register (LFSR) sequence value when said load enable signal is low; and
    wherein said plurality of pre-load flip flop (PLFF) circuits hold a second linear feedback shift register (LFSR) sequence value when said load enable signal is high.

10. A linear feedback shift register as claimed in claim 9 capable of operating in a frequency range from approximately six hundred million cycles per second (600 MHz) to approximately nine hundred million cycles per second (900 MHz) where said linear feedback shift register utilizes 0.18 micron process technology and standard flip flop circuits for said pre-load flip flop (PLFF) circuits and for said linear feedback shift register (LFSR) flip flop circuits.

11. A linear feedback shift register as claimed in claim 9 capable of operating in a frequency range from approximately one billion two hundred million cycles per second (1.2 GHz) to approximately one billion five hundred million cycles per second (1.5 GHz) where said linear feedback shift register utilizes 0.18 micron process technology and custom designed flip flop circuits for said pre-load flip flop (PLFF) circuits and for said linear feedback shift register (LFSR) flip flop circuits.

12. A phase locked loop clock divider circuit comprising a linear feedback shift register of the type comprising a plurality of linear feedback shift register (LFSR) flip flop circuits and a plurality of linear feedback shift register (LFSR) multiplexers alternately coupled together, where an input of each LFSR flip flop circuit is coupled to an output of an LFSR multiplexer, and where an output of each LFSR flip flop circuit may be provided to an input of an LFSR multiplexer, said linear feedback shift register comprising:
    a plurality of pre-load flip flop (PLFF) circuits and a plurality of pre-load flip flop (PLFF) multiplexers alternately coupled together, where an input of each PLFF flip flop circuit is coupled to an output of a PLFF multiplexer, and where an output of each PLFF flip flop circuit is coupled to an input of a LFSR multiplexer.

13. A phase locked loop clock divider circuit as claimed in claim 12 wherein said each of said plurality of PLFF multiplexers has a first input coupled to one bit of an input register value and a second input coupled to another bit of said input register value.

14. A phase locked loop clock divider circuit as claimed in claim 13 having n bits and a polynomial equation of R[m]+R[p] where m is an integer less than n and where p is an integer less than n wherein a PLFF multiplexer that is coupled to a first PLFF flip flop circuit has one input coupled to an input register value bit equal to N[0] when a load enable signal coupled to said PLFF multiplexer is low and another input coupled to an input register value bit equal to N[m] XNORed with N[p] when said load enable signal coupled to said PLFF multiplexer is high.

15. A phase locked loop clock divider circuit as claimed in claim 14 comprising a circuit in a feedback path of said linear feedback shift register, wherein said circuit is capable of performing an exclusive NOR function on an output signal of one of said plurality of LFSR flip flop circuits and on an output signal of another one of said plurality of LFSR flip flop circuits.

16. A phase locked loop clock divider circuit as claimed in claim 13 comprising a linear feedback shift register having six (6) bits and a polynomial equation of R[5]+R[4] wherein a PLFF multiplexer that is coupled to a first PLFF flip flop circuit has one input coupled to an input register value bit equal to N[0] when a load enable signal coupled to said PLFF multiplexer is low and another input coupled to an input register value bit equal to N[4] XNORed with N[5] when said load enable signal coupled to said PLFF multiplexer is high.

17. A phase locked loop clock divider circuit as claimed in claim 16 comprising a circuit in a feedback path of said linear feedback shift register, wherein said circuit is capable of performing an exclusive NOR function on an output signal of an LFSR4 flip flop circuit and on an output signal of an LFSR3 flip flop circuit of said plurality of LFSR flip flop circuits.

18. A phase locked loop clock divider circuit as claimed in claim 17 wherein said circuit in said feedback path comprises:
    a multiplexer having a first input connected to an output of said LFSR3 flip flop circuit, and having a second input connected to an inverted version of said output of said LFSR3 flip flop circuit, and having a load enable input coupled to an output of said LFSR4 flip flop circuit; and
    a flip flop circuit having an input coupled to an output of said multiplexer and an output coupled to said feedback path.

19. A phase locked loop clock divider circuit as claimed in claim 14 wherein each LFSR multiplexer and each PLFF multiplexer has an enable signal input line connected to a load enable circuit that provides a load enable signal that is high for two input clock cycles.

20. A phase locked loop clock divider circuit as claimed in claim 19 wherein said plurality of pre-load flip flop (PLFF) circuits hold a first linear feedback shift register (LFSR) sequence value when said load enable signal is low; and wherein said plurality of pre-load flip flop (PLFF) circuits hold a second linear feedback shift register (LFSR) sequence value when said load enable signal is high.

21. A phase locked loop clock divider circuit as claimed in claim 20 capable of operating in a frequency range from approximately six hundred million cycles per second (600 MHz) to approximately nine hundred million cycles per second (900 MHz) where said linear feedback shift register utilizes 0.18 micron process technology and standard flip flop circuits for said pre-load flip flop (PLFF) circuits and for said linear feedback shift register (LFSR) flip flop circuits.

22. A phase locked loop clock divider circuit as claimed in claim 20 capable of operating in a frequency range from approximately one billion two hundred million cycles per second (1.2 GHz) to approximately one billion five hundred million cycles per second (1.5 GHz) where said linear feedback shift register utilizes 0.18 micron process technology and custom designed flip flop circuits for said pre-load flip flop (PLFF) circuits and for said linear feedback shift register (LFSR) flip flop circuits.

23. A method for providing a linear feedback shift register having n bits where n is an integer, said method comprising the steps of:

alternately coupling together a plurality of linear feedback shift register (LFSR) flip flop circuits and a plurality of linear feedback shift register (LFSR) multiplexers, where an input of each LFSR flip flop circuit is coupled to an output of an LFSR multiplexer, and where an output of each LFSR flip flop circuit may be provided to an input of an LFSR multiplexer;

alternately coupling together a plurality of pre-load flip flop (PLFF) circuits and a plurality of pre-load flip flop (PLFF) multiplexers, where an input of each PLFF flip flop circuit is coupled to an output of a PLFF multiplexer, and where an output of each PLFF flip flop circuit is coupled to an input of an LFSR multiplexer;

coupling an input register value bit to a first input of each of said plurality of PLFF multiplexers;

coupling an input register value bit to a second input of each of said plurality of PLFF multiplexers;

coupling to one input of a PLFF multiplexer that is coupled to a first PLFF flip flop circuit an input register value bit that is equal to N[0] when a load enable signal coupled to said PLFF multiplexer is low;

coupling to another input of said PLFF multiplexer that is coupled to said first PLFF flip flop circuit an input register value bit that is equal to N[m] XNORed with N[p] where said linear feedback shift register (LFSR) has a polynomial equation of R[m]+R[p] where m is an integer less than n and where p is an integer less than n.

24. A method as claimed in claim 23 further comprising the step of:

coupling to an input of an LFSR multiplexer a feedback signal generated by performing an exclusive NOR function on an output signal of one of said plurality of LFSR flip flop circuits and on an output signal of another one of said plurality of LFSR flip flop circuits.

25. A method as claimed in claim 24 where the value of n is six (6) and the value of m is five (5) and the value of p is (4).

26. A method as claimed in claim 25 wherein said step of coupling to an input of an LFSR multiplexer a feedback signal generated by performing an exclusive NOR function on an output signal of one of said plurality of LFSR flip flop circuits and on an output signal of another one of said plurality of LFSR flip flop circuits comprises the step of:

coupling to an input of an LFSR multiplexer a feedback signal generated by performing an exclusive NOR function on an output signal of an LFSR4 flip flop circuit and on an output signal of an LFSR3 flip flop circuit of said plurality of LFSR flip flop circuits.

27. A method as claimed in claim 24 further comprising the steps of:

coupling to an enable signal input line of each LFSR multiplexer and to an enable signal input line of each PLFF multiplexer a load enable signal that is high for two input clock cycles;

holding in said plurality of pre-load flip flop (PLFF) circuits a first linear feedback shift register (LFSR) sequence value when said load enable signal is low; and holding in said plurality of pre-load flip flop (PLFF) circuits a second linear feedback shift register (LFSR) sequence value when said load enable signal is high.

28. A method as claimed in claim 27 comprising the steps of:

fabricating said linear feedback shift register with 0.18 micron technology;

providing standard flip flop circuits for said pre-load flip flop (PLFF) circuits and for said linear feedback shift register (LFSR) flip flop circuits; and operating said linear feedback shift register within a frequency range from approximately six hundred million cycles per second (600 MHz) to approximately nine hundred million cycles per second (900 MHz).

29. A method as claimed in claim 27 comprising the steps of:

fabricating said linear feedback shift register with 0.18 micron technology;

providing custom designed flip flop circuits for said pre-load flip flop (PLFF) circuits and for said linear feedback shift register (LFSR) flip flop circuits; and operating said linear feedback shift register within a frequency range from approximately one billion two hundred million cycles per second (1.2 GHz) to approximately one billion five hundred million cycles per second (1.5 GHz).

* * * * *